United States Patent
Hayashi et al.

(10) Patent No.: US 6,388,510 B2
(45) Date of Patent: May 14, 2002

(54) TRANSCONDUCTANCE-CAPACITANCE FILTER SYSTEM

(75) Inventors: Hiroki Hayashi, Kawasaki; Shiro Doushoh, Ikeda; Takashi Morie, Ibaraki; Kunihiro Fujiyama, Takatsuki; Tomoyuki Katada, Kawasaki, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/903,948

(22) Filed: Jul. 12, 2001

(30) Foreign Application Priority Data

Jul. 21, 2000 (JP) ........................... 2000-220778

(51) Int. Cl.$^7$ ................................ H03B 1/00
(52) U.S. Cl. ................. 327/552; 327/520; 327/513
(58) Field of Search ................. 327/552, 553, 327/557, 558, 559, 520, 371, 377, 384, 512, 513

(56) References Cited

U.S. PATENT DOCUMENTS

| | | | | |
|---|---|---|---|---|
| 5,023,491 A | * | 6/1991 | Koyama | 327/553 |
| 5,093,634 A | | 3/1992 | Khoury | 331/108 B |
| 5,227,743 A | * | 7/1993 | Yamamoto | 333/17.1 |
| 5,489,872 A | * | 2/1996 | Gopinathan | 327/552 |
| 5,570,049 A | | 10/1996 | Chen | 327/103 |
| 5,572,163 A | * | 11/1996 | Kimura et al. | 327/553 |
| 5,594,383 A | * | 1/1997 | Tamba | 327/552 |
| 5,625,317 A | * | 4/1997 | Deveirman | 327/353 |
| 5,745,001 A | * | 4/1998 | Ueshima et al. | 327/553 |
| 5,942,935 A | * | 8/1999 | Okanobu | 327/553 |
| 6,107,870 A | * | 8/2000 | Kawano | 327/553 |
| 6,239,654 B1 | * | 5/2001 | Yamamoto | 330/9 |

FOREIGN PATENT DOCUMENTS

| | | |
|---|---|---|
| JP | 05-121503 | 5/1993 |
| JP | 10-209809 | 8/1998 |

\* cited by examiner

*Primary Examiner*—Kenneth B. Wells
*Assistant Examiner*—Hai L. Nguyen
(74) *Attorney, Agent, or Firm*—Pearne & Gordon LLP

(57) ABSTRACT

A gm-C filter system having low power consumption is provided. An adjusting circuit 2 is equipped with an oscillator 3 constructed of a gm amplifier 3a having the same arrangement as that of a gm amplifier 1a of a gm-C filter circuit 1. The adjusting circuit 2 generates a digital adjusting value "$D_{gm}$" based upon an oscillation signal OSC outputted from this oscillation 3, and this digital adjusting value "$D_{gm}$" is used to adjust a gm value of the gm amplifier 3a of the oscillator 3. This digital adjusting value "$D_{gm}$" is held in a register 10. The digital adjusting value "$D_{gm}$" held in this register 10 is converted into an analog adjusting value (bias current) by a D/A converter 8, and then, this analog adjusting value is supplied to the gm amplifier 1a of the gm-C filter circuit 1 so as to adjust the gm value. The adjusting circuit 2 is operated in an intermittent manner based upon, for example, a change contained in ambient temperatures of the gm-C filter system.

6 Claims, 7 Drawing Sheets

TRANSCONDUCTANCE-CAPACITANCE FILTER SYSTEM

BACKGROUND OF THE INVENTION

The present invention is related to a transconductance-capacitance filter system equipped with a transconductance-capacitance filter circuit and an adjusting circuit thereof.

For instance, transconductance-capacitance filter systems (will be referred to as a "gm-C filer system" hereinafter) are employed in portable electronic appliances such as portable telephone sets. FIG. 7 schematically represents an example of conventional gm-C filter systems. This gm-C filter system is equipped with a transconductance-capacitance filter circuit (will be referred to as a "gm-C filter circuit hereinafter) 1, and an adjusting circuit 16 for adjusting a cut-off frequency of this gm-C filter circuit 1. The gm-C filter circuit 1 is arranged by employing a transconductance amplifier (will be referred to as a "gm amplifier" hereinafter) 1a and a capacitor 1b, and may constitute, for example, a low-pass filter. On the other hand, the adjusting circuit 1b is provided with an oscillator 3 having a gm amplifier 3a and a capacitor 3b, comparators 14 and 15 designed for waveform shaping operation, and a frequency comparator 13. In this case, the gm amplifier 3a of the oscillator 3 owns the same structure as that of the gm amplifier 1a of the gm-C filter circuit 1.

In the gm-C filter system arranged in the above-explained manner, an oscillation signal OSC is supplied from the oscillator 3 via the comparator 14 to the frequency comparator 13, and also a reference clock signal CK is supplied from an externally provided crystal oscillator (not shown) via the comparator 15 to this frequency comparator 13, so that the frequency of the oscillation signal OSC is compared with the frequency of the reference clock signal CK. In other words, in the frequency comparator 13, a bias current "$i_{BIAS}$" is produced based upon a frequency error of the oscillation signal OSC with respect to the reference clock signal CK. This bias current "$i_{BIAS}$" is supplied to the gm amplifier 3a employed in the oscillator 3 so as to adjust a value of a transconductance (will be referred to as a "gm value" hereinafter) of the gm amplifier 3a. For example, in such a case that the oscillation frequency of the oscillator 3 is higher than the frequency of the reference clock signal CK corresponding to the set value, such a bias current "$i_{BIAS}$" capable of reducing the gm value of the gm amplifier 3a employed in the oscillator 3 is outputted from the frequency comparator 13, so that the oscillation frequency of the oscillator 3 is reduced. Conversely, in such a case that the oscillation frequency of the oscillator 3 is lower than the frequency of the reference clock signal CK corresponding to the set value, such a bias current "$i_{BIAS}$" capable of increasing the gm value of the gm amplifier 3a employed in the oscillator 3 is outputted from the frequency comparator 13, so that the oscillation frequency of the oscillator 3 is increased. In other words, the bias current "$i_{BIAS}$" is varied in such a manner that the oscillation frequency of the oscillator 3 is made coincident with the frequency of the reference clock signal CK, so that the gm value of the gm amplifier 3a employed in the oscillator 3 is adjusted.

On the other hand, the bias current "$i_{BIAS}$" supplied from the frequency comparator 13 is also supplied to the gm amplifier 1a provided in the gm-C filter circuit 1 so as to adjust the gm value of this gm amplifier. As a result, the cut-off frequency is adjusted. In this case, since the gm amplifier 3a of the oscillator 3 owns the same structure as that of the gm-C filter circuit 1, the oscillation frequency of the oscillator 3 may correspond to the cut-off frequency of the gm-C filter circuit 1 in an one-to-one correspondence relationship. As a consequence, in order to set the cut-off frequency of the gm-C filter circuit 1 to a desirable frequency value, the oscillation frequency of the oscillator 3 may be adjusted based upon such a frequency clock signal CK having a frequency corresponding to this desirable frequency value.

However, in the above-explained conventional gm-C filter system, there is such a serious problem. That is, the adjusting circuit 16 arranged by the oscillator 3, the comparators 14/15, and the frequency comparator 13 is continuously operated so as to adjust the cut-off frequency of the gm-C filter circuit 1. Since this adjusting circuit 16 is continuously operated, the power consumption of the entire gm-C filter system would be increased.

SUMMARY OF THE INVENTION

The present invention has been made to solve such a conventional problem, and therefore, has an object to provide a gm-C filter system having low power consumption.

To achieve the above-described object, according to a first aspect of the present invention, a transconductance-capacitance filter system comprises: a transconductance-capacitance filter circuit including a transconductance amplifier and a capacitor; an adjusting circuit including an oscillator containing a transconductance amplifier having the same structure as that of the transconductance amplifier of the transconductance-capacitance filter circuit, the adjusting circuit producing a digital adjusting value used to adjust the transconductance of the transconductance amplifier of the oscillator based upon an oscillation signal outputted from the oscillator; a register for holding the digital adjusting value supplied from the adjusting circuit; and a D/A converter for converting the digital adjusting value held in the register into an analog adjusting value which is used to adjust the transconductance of the transconductance amplifier of the transconductance capacitance filter circuit; wherein the adjusting circuit is operated in an intermittent manner.

A transconductance-capacitance filter system, according to a second aspect of the present invention, transconductance further comprises a temperature sensing circuit for sensing an ambient temperature of the transconductance-capacitance filter system, and wherein the adjusting circuit is operated in the intermittent manner based upon a change contained in the ambient temperatures.

A transconductance-capacitance filter system, according to a third aspect of the present invention, transconductance further comprises a power supply voltage sensing circuit for sensing a power supply voltage of the transconductance-capacitance filter system, and wherein the adjusting circuit is operated in the intermittent manner based upon a change contained in the power supply voltages.

A transconductance-capacitance filter system, according to a fourth aspect of the present invention, transconductance further comprises a temperature sensing circuit for sensing an ambient temperature of the transconductance capacitance filter system, and a power supply voltage sensing circuit for sensing a power supply voltage of the transconductance-capacitance filter system, and wherein the adjusting circuit is operated in the intermittent manner based upon either a change contained in the ambient temperatures or a variation of the power supply voltages.

Also, according to a fifth aspect of the present invention, a transconductance-capacitance filter system comprises: a transconductance-capacitance filter circuit including a transconductance amplifier and a capacitor; an adjusting circuit including an oscillator containing a transconductance amplifier having the same structure as that of the transconductance amplifier of the transconductance-capacitance filter circuit, the adjusting circuit producing a digital adjusting the transconductance of the transconductance amplifier of the oscillator based upon an oscillation signal outputted from the oscillator; a register for holding the digital adjusting value supplied from the adjusting circuit; a D/A converter for converting the digital adjusting value held in the register into an analog adjusting value which is used to adjust the transconductance of the transconductance amplifier of the transconductance-capacitance filter circuit; and a temperature compensating circuit for producing such a drive bias current capable of compensating for a variation component of the transconductance values of the transconductance amplifier of the transconductance-capacitance filter circuit with respect to a change contained in ambient temperatures of the transconductance-capacitance filter system based upon externally-supplied temperature data, and capable of driving the D/A converter by the drive bias current, wherein the adjusting circuit is operated only when the transconductance capacitance filter system is initiated.

Further, according to a sixth aspect of the present invention, a transconductance-capacitance filter system comprises a transconductance-capacitance filter circuit including a transconductance amplifier and a capacitor; an adjusting circuit including an oscillator containing a transconductance amplifier having the same structure as that of the transconductance amplifier of the transconductance-capacitance filter circuit, the adjusting circuit for producing a digital adjusting the transconductance of the transconductance amplifier of the oscillator based upon an oscillation signal outputted from the oscillator; a register for holding the digital adjusting value supplied from the adjusting circuit; a temperature compensating circuit for producing such a drive bias current capable of compensating for a variation component of the transconductance values of the transconductance amplifier of the transconductance-capacitance filter circuit with respect to a change contained in ambient temperatures of the transconductance-capacitance filter system based upon externally-supplied temperature data, and capable of driving the D/A converter by the drive bias current; an adder for executing a digital calculation with respect to the compensating digital adjusting value supplied from the temperature compensating circuit and the digital adjusting value held in the register; and a D/A converter for converting a digital calculation result supplied form the adder into an analog adjusting value which is used to adjust the transconductance of the transconductance amplifier of the transconductance-capacitance filter circuit, wherein the adjusting circuit is operated only when the transconductance-capacitance filter system is initiated.

DETAILED DESCRIPTION OF THE PREFERRED EMBODIMENTS

Referring now to drawing, embodiment modes of the present invention will be described in detail.

(First Embodiment Mode)

Figure 1:
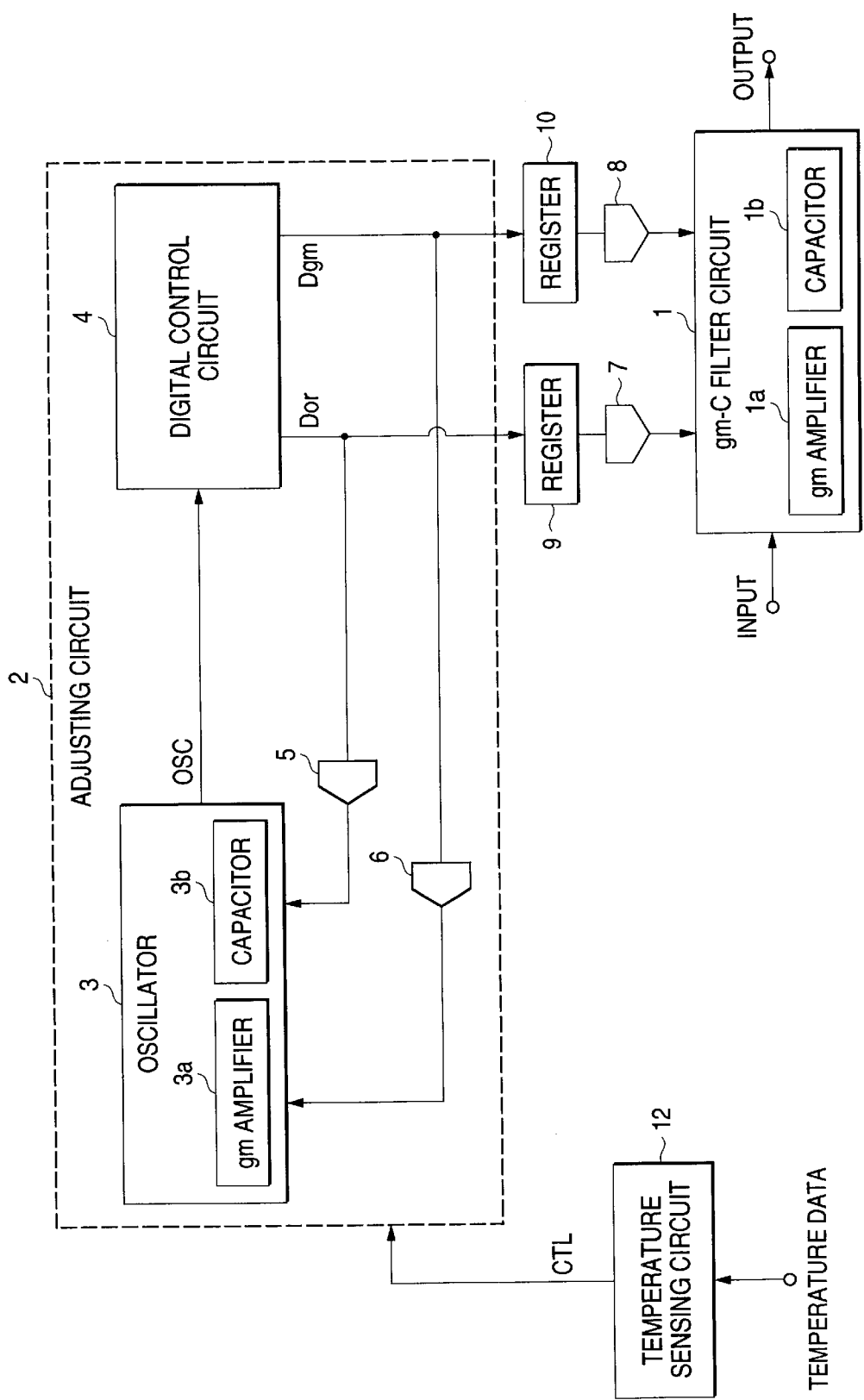
FIG. 1 is a block diagram for showing an arrangement of a gm-C filter system according to a first embodiment mode of the present invention.

FIG. 1 is a block diagram for representing an arrangement of a gm-C filter system according to a first embodiment of the present invention. In FIG. 1, the gm-C filter system is provided with a gm-C filter circuit 1, an adjusting circuit 2, registers 9 and 10, digital-to-analog converters (will be referred to as "D/A converters" hereinafter) 7 and 8, and a temperature sensing circuit 12. The adjusting circuit 2 adjusts a filter characteristic (both cut-off frequency and output amplitude) of this gm-C filter circuit 1. The registers 9 and 10 are employed so as to hold digital adjusting values outputted from the adjusting circuit 2. The D/A converters 7 and 8 convert the digital adjusting values held in these registers 9 and 10 into analog adjusting values, and supply the analog adjusting values to the gm-C filter circuit 1. The temperature sensing circuit 12 senses an ambient temperature of this gm-C filter system based upon temperature data which is supplied from an external device so as to control the operation of the adjusting circuit 2.

The gm-C filter circuit 1 is arranged by employing a gm amplifier 1a and a capacitor 1b, and constitutes, for example, a low-pass filter. On the other hand, the adjusting circuit 2 is arranged by employing an oscillator 3, a digital control circuit 4, a D/A converter 5, and another D/A converter 6. The oscillator 3 is constructed of a gm amplifier 3a and a capacitor 3b. The digital control circuit 4 produces a digital adjusting value based upon an oscillation signal OSC outputted from this oscillator 3 to output the produced digital adjusting value. The D/A converter 5 converts an adjusting value "$D_{or}$" into a corresponding analog adjusting value, and then supplies this analog adjusting value as a bias current to the gm amplifier 3a. This adjusting value "$D_{or}$" is to adjust output resistance values of the gm amplifiers 3a and 1a among the digital adjusting values outputted from the digital control circuit 4. The D/A converter 6 converts another adjusting value "$D_{gm}$" into a corresponding analog adjusting value, and supplies this analog adjusting value as another bias current to the gm amplifier 3a. The adjusting value "$D_{gm}$" is to adjust the gm values of the gm amplifiers 3a and 1a among the above-explained digital adjusting values. In this case, since the output resistance value of the gm amplifier 3a is adjusted, the oscillation amplitude of the oscillator 3 is adjusted. Also, since the gm value of the gm amplifier 3a is adjusted, the oscillation frequency of the oscillator 3 is adjusted. It should be noted that the gm amplifier 3a of the oscillator 3 owns the same construction as that of the gm amplifier 1a of the gm-C filter circuit 1.

Also, the digital adjusting value "$D_{or}$" outputted from the digital control circuit 4 is also supplied as a analog adjusting value (bias current) via both the register 9 and the D/A converter 7 to the gm amplifier 1a. On the other hand, the digital adjusting value "$D_{gm}$" outputted from the digital control circuit 4 is also supplied via both the register 10 and the D/A converter 8 as another analog adjusting value (bias current) to the gm amplifier 1a. In this case, since the output resistance value of the gm amplifier 1a is adjusted so as to become zero, an error contained in the filter characteristic of the gm-C filter circuit 1 is reduced. Also, since the gm value of the gm amplifier 1a is adjusted, the cut-off frequency of the gm-C filter circuit 1 is adjusted.

Since the gm amplifier 3a of the oscillator 3 owns the same construction as that of the gm amplifier 1a of the gm-C filter circuit 1, the oscillation frequency of the oscillator 3 corresponds to the cut-off frequency of the gm-C filter circuit 1 in an one-to-one correspondence relationship. As a result, in order to set the cut-off frequency of the gm-C filter circuit 1 to a desirable value, the oscillation frequency of the oscillator 3 maybe adjusted to be equal to a value corresponding to this desirable value.

Figure 2:
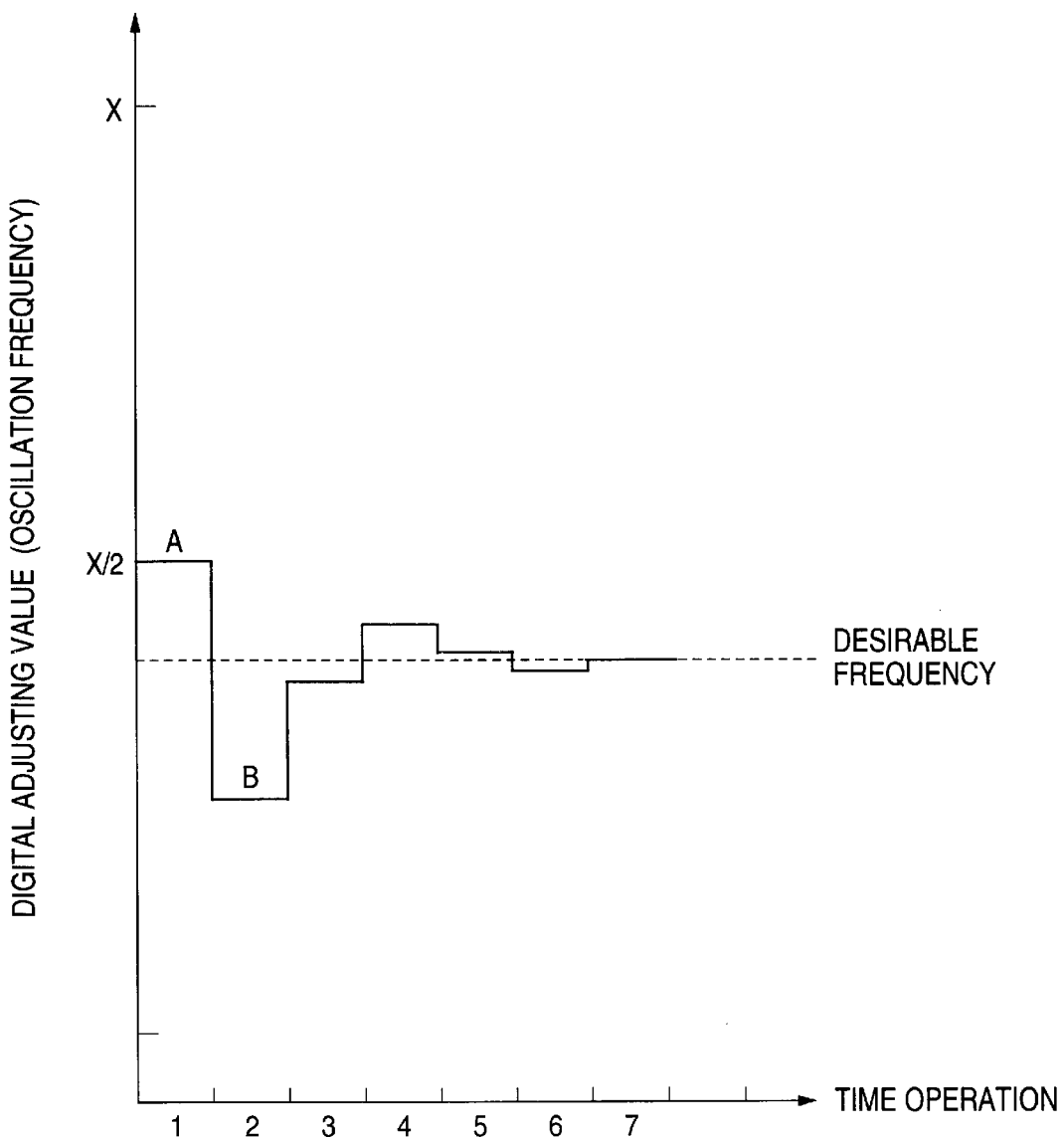
FIG. 2 is an explanatory diagram for explaining a method for setting a digital adjusting value (two-dividing method) outputted from a digital control circuit, corresponding to an oscillation frequency of an oscillator 3.

In the case that the digital adjusting value $D_{gm}$ outputted from the digital control circuit 4 corresponding to the oscillation frequency of the oscillator 3 is set, for instance, a so-called "two-dividing method" is employed. Referring now to FIG. 2, this two-dividing method will be described. In FIG. 2, an ordinate shows the digital adjusting value "$D_{gm}$" (oscillation frequency), and an abscissa indicates a time operation. It should be understood that the digital adjusting value "$D_{gm}$" is constituted by "n" bits (symbol "n"=natural number). In this case, a description will now be made of such a case that the digital adjusting value "$D_{gm}$" is constructed of 7 bits. First, assuming now that a 7-bit digital value (for example, maximum value) is equal to "X" when the gm-C filter system is initiated, this digital adjusting value "$D_{gm}$" is set to "X/2" equal to a ½ value of this 7-bit digital value (namely, condition shown as "A" of FIG. 2). Then, while the oscillation frequency of the oscillator 3 is monitored, in such a case that this monitored oscillation frequency is compared with a desirable frequency and then this oscillation frequency is lower than the desirable frequency, the digital adjusting value "$D_{gm}$" is set to {X/2−(X−X/2)X½}=3X/4. On the other hand, when this monitored oscillation frequency is higher than the desirable frequency, the digital adjusting value $D_{gm}$ is set to {X/2−(X−X/2)X½}=X/4. In the example, shown in FIG. 2, since the oscillation frequency is higher than the desirable frequency under state "A", the digital adjusting value "$D_{gm}$" is set to "X/4", (namely, state "B" shown in FIG. 2). Then, the oscillation frequency is again monitored. Now since the oscillation frequency is lowered than the desirable frequency, {X/4+X/2−X/4)X½}=3 X/8 is set as a next digital adjusting value. Subsequently, the digital adjusting value "$D_{gm}$" is controlled in such a manner that the oscillation frequency is made coincident with a desirable frequency. In such a case that the digital adjusting value $D_{gm}$ is arranged by 7 bits, an adjusting value corresponding to the desirable frequency can be obtained in a seventh time operation.

Figure 3A:
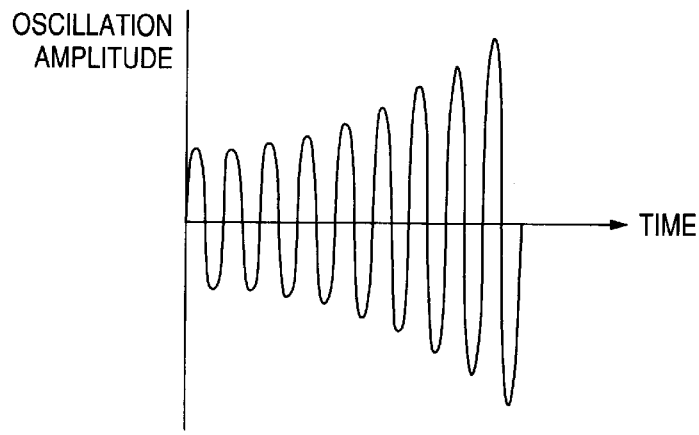
FIG. 3 is a waveform diagram for describing a method for adjusting an oscillation amplitude of the oscillator 3.
Figure 3B:
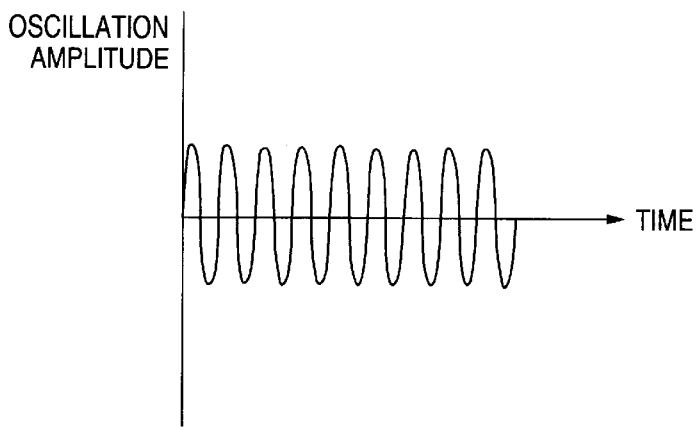
Figure 3C:
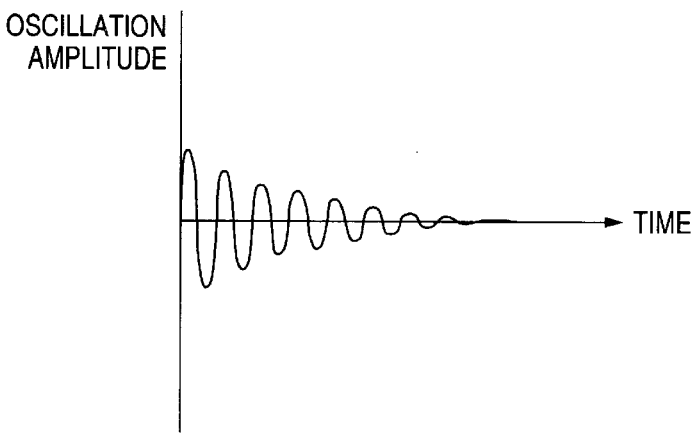

Referring now to FIGS. 3A to 3C, a description will be made of a method for adjusting an oscillating amplitude of the oscillator 3. As indicated in FIG. 3A to FIG. 3C, the oscillation amplitude of the oscillator 3 is varied based upon the output resistance value of the gm amplifier 3a thereof. In other words, in the case that the output resistance value is negative, an oscillation signal is diverged as indicated in FIG. 3A. Conversely, in the case that the output resistance value is positive, an oscillation signal is attenuated, so that an oscillation state is not maintained as indicated in FIG. 3C. In accordance with this embodiment mode, as represented in FIG. 3B, in order to realize such a state that the oscillation is maintained with keeping a constance amplitude, the output resistance value of the gm amplitude 3a is adjusted as follows. In other words, for instance, while the output resistance value of the gm amplitude 3a is changed in 5 stages, a judgement is made as to whether the oscillation is diverged, or attenuated in each stage. Then, the output resistance value of the gm amplifier 3a is adjusted to be equal to such a value defined between the output resistance value obtained when the oscillation is diverged and the output resistance value obtained when the oscillation is attenuated.

It should also be noted that when the above-explained oscillation frequency adjusting method (two-dividing method) is combined with the oscillation amplitude adjusting method, if the oscillation frequency is adjusted, then the oscillator 3 is required to be brought into the oscillation state. As a result, the output resistance value of the gm amplifier 3a is set in such a manner that the oscillation may be likely diverged, and the oscillation frequency is adjusted. Thereafter, the oscillation amplitude is adjusted.

Figure 4A:
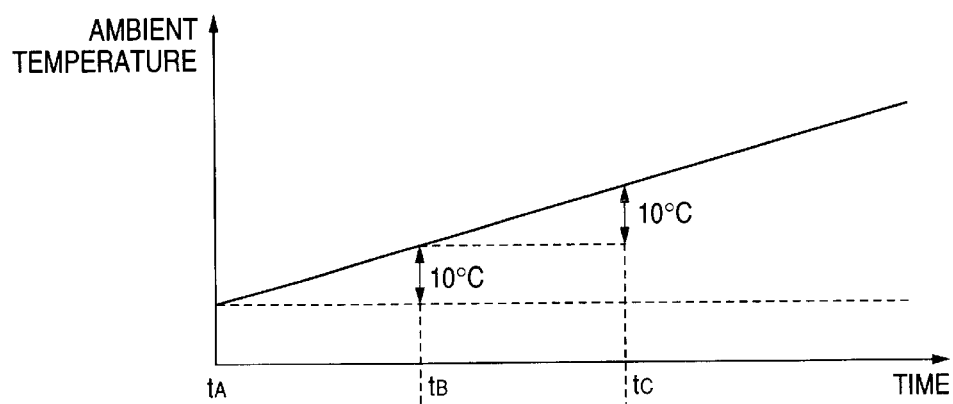
FIG. 4 is a time chart for explaining operation of an adjusting circuit 2.
Figure 4B:
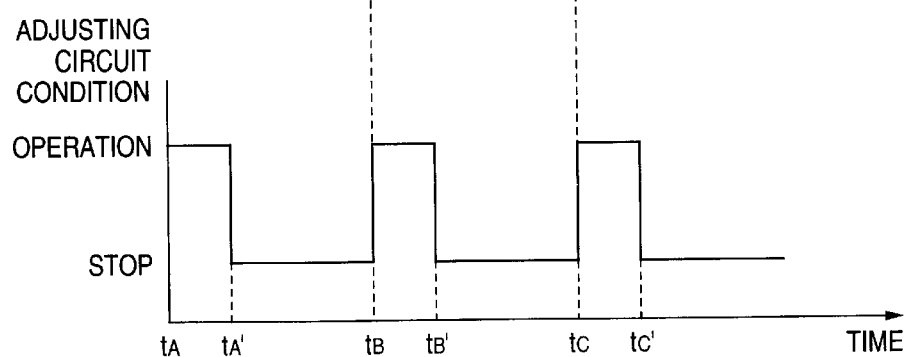

Next, operations of the adjusting circuit 2 will now be explained with reference to a time chart of FIGS. 4A and 4B. FIG. 4A indicates a change contained in ambient temperatures of the filter system, and FIG. 4B shows a change contained in operation conditions of the adjusting circuit 2. First, the adjusting circuit 2 commences the adjusting operation of the filter characteristic when the gm-C filter system is initiated (time instance "$t_A$"). After the adjusting operation has been ended, both the digital adjusting values "$D_{or}$" and "$D_{gm}$" supplied from the adjusting circuit 2 are held in the registers 9 and 10, respectively, and the operation of the adjusting circuit 20 is stopped (power off state, time instance $t_{A'}$). While the operation of the adjusting circuit 2 is stopped (power off), both the digital adjusting values $D_{or}$ and $D_{gm}$ saved in the registers 9 and 10 are supplied via the D/A converts 7/8 as analog adjusting values (bias currents) to the gm amplifier 1a of the gm-C filter circuit 1. Thereafter, the adjusting circuit 2 is controlled in response to a control "CTL" supplied from the temperature sensing circuit 12. The temperature sensing circuit 12 senses the ambient temperature of the gm-C filter system in response to the externally supplied temperature data. This temperature sensing circuit 12 supplies the control signal CTR in order that at a time instant (time instant $t_B$) when the ambient temperature is changed by, for example, 10 degrees, the operation of the adjusting circuit 2 is commenced. In response to this control signal CTR, the adjusting circuit 2 commences the adjusting operation of the filter characteristic. After the adjusting operation has been accomplished, the respective adjusting values $D_{or}$ and $D_{gm}$ saved in the resisters 9 and 10 are updated, the operation of the adjusting circuit 2 is stopped (power off) at a time instant $t_{B'}$. Subsequently, the adjusting circuit 2 repeatedly performs such an intermittent adjusting operation (time instants tc and tc').

As previously described, in accordance with the gm-C filter system of this embodiment mode, the adjusting circuit 2 is operated in the intermittent manner in order to adjust the filter characteristic. As a result, the power consumption of this gm-C filter system can be reduced, as compared with that of the conventional filter system.

It should be noted that the temperature sensing circuit 12 may be replaced by a power supply voltage sensing circuit. In this alternative case, for instance, the power supply voltage of this gm-C filter system is subdivided into just a half of this supply voltage by employing a resistor, and then, this voltage may be entered to the power supply voltage sensing circuit. In the power supply voltage sensing circuit, for example, while an input voltage is converted into a digital value by an A/D converter, a digital signal processing operation is carried out in such a manner that the control signal CTL is outputted to the control circuit 2 by which the operation of the adjusting circuit 2 is commenced when the voltage is changed by 0.1 V. In this operation manner, the adjusting circuit may be intermittently carried out based upon the variation of the power supply voltage.

Alternatively, both the above-explained temperature sensing circuit 12 and the power supply voltage sensing circuit may be employed. In this alternative case, the control signal outputted from the temperature sensing circuit is AND-gated with the control signal outputted from the power supply voltage sensing circuit, and then, the AND-gated control signal is used to control the adjusting circuit 2. Since such an AND-gated control signal is used, the adjusting circuit 2 may be intermittently operated based upon either a change contained in the ambient temperatures or a variation contained in the power supply voltages.

Also, the temperature sensing circuit 12 may be replaced by a counter circuit. In this alternative case, while the reference clock signal is input into this counter circuit, at such a time instant when a count value of this counter circuit is reached to a predetermined, the control signal CTL is supplied from this counter circuit with respect to the adjusting circuit 2 in order to commence the operation of the adjusting circuit 2. At this time, the counter circuit is reset. As a result, the adjusting circuit 2 may be intermittently operated in response to an elapse of time.

Alternatively, the operation of the adjusting circuit 2 may be commenced within systematically empty time of an electronic appliance in which the gm-C filter system is employed.

It should also be understood that the adjustment of the output amplitude of the gm-C filter circuit 1 is no longer required, the above-explained D/A converter 5, register 9, and D/A converter 7 may be omitted.

(Second Embodiment Mode)

Figure 5:
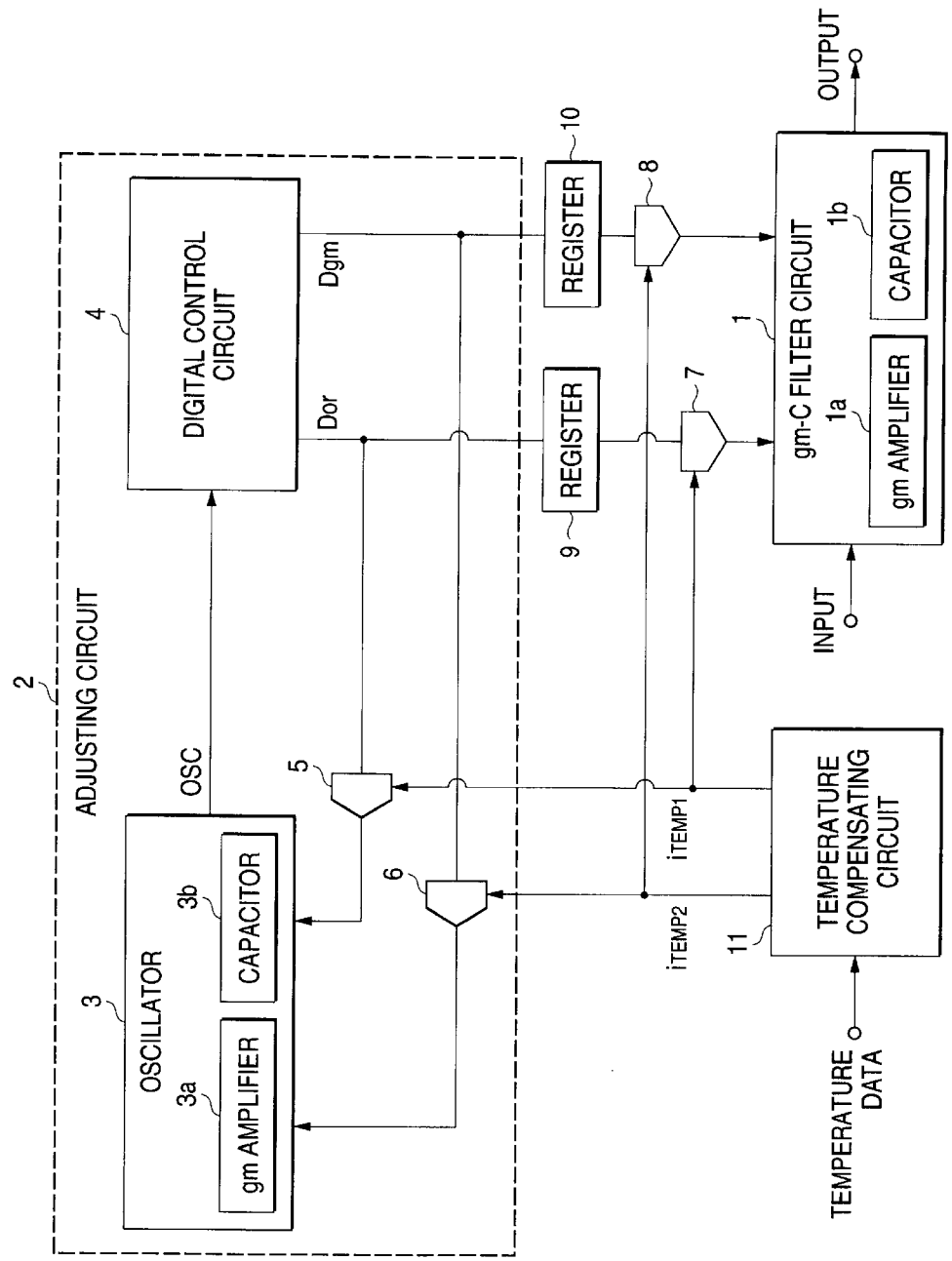
FIG. 5 is a block diagram for indicating an arrangement of a gm-C filter system according to a second embodiment mode of the present invention.

FIG. 5 is a block diagram for representing an arrangement of a gm-C filter system according to a second embodiment mode of the present invention. It should be noted that the same reference numerals used in the first embodiment mode shown in FIG. 1 will be employed as those for denoting the same, or similar constructions of this second embodiment mode, and therefore, descriptions thereof are omitted. In FIG. 5, a temperature compensating circuit 11 produces a drive bias current "$i_{TEMP1}$" based upon externally-supplied temperature data, and this drive bias current "$i_{TEMP1}$" is to compensate a variation component of output resistance values derived from the gm amplifiers 3a and 1a with respect to a change contained in ambient temperature. This temperature compensating circuit 11 drives the D/A converters 5 and 7 based upon this drive bias current "$i_{TEMP1}$" capable of compensating for variation components in gm values of both the gm amplifiers 3a and 1a with respect to a change contained in ambient temperatures. Then, the temperature compensating circuit 11 drives the D/A converters 6 and 8 based upon this drive bias current $i_{TEMP2}$. The temperature compensating circuit 11 produces both the drive bias currents "$i_{TEMP1}$" and "$i_{TEMP2}$" based upon, for instance, data related to temperature-to-drive bias currents stored in a ROM.

Next, a description will now be made of operations of the gm-C filter system according to this embodiment mode. First, the adjusting circuit 2 commences the adjusting operation of the filter characteristic when the gm-C filter system is initiated. After the adjusting operation has been ended, both the digital adjusting values "$D_{or}$" and "$D_{gm}$" supplied from the adjusting circuit 2 are held in the registers 9 and 10, respectively, and the operation of the adjusting circuit 20 is stopped (power off state). While the operation of the adjusting circuit 2 is stopped (power off), both the digital adjusting value $D_{or}$ and $D_{gm}$ saved in the registers 9 and 10 are supplied via the D/A converters 7/8 as analog adjusting values (bias currents) to the gm amplifier 1a of the gm-C filter circuit 1. Thereafter, once the operation of the adjusting circuit 2 is stopped (power off), even when the ambient temperature is changed, the adjusting circuit 2 is not operated, which is different from the above-explained operation of the first embodiment mode. Instead, both the drive bias currents "$i_{TEMP1}$" and "$i_{TEMP2}$" are supplied from the temperature compensating circuit 11 to the D/A converters 7/8, respectively, so that the filter characteristic is adjusted.

As previously explained, in accordance with the gm-C filter system of this embodiment mode, the adjusting circuit 2 is operated only when the gm-C filter system is initiated in order to adjust the filter characteristic, so that the power consumption can be reduced, as compared with that of the conventional filter system.

(Third Embodiment Mode)

Figure 6:
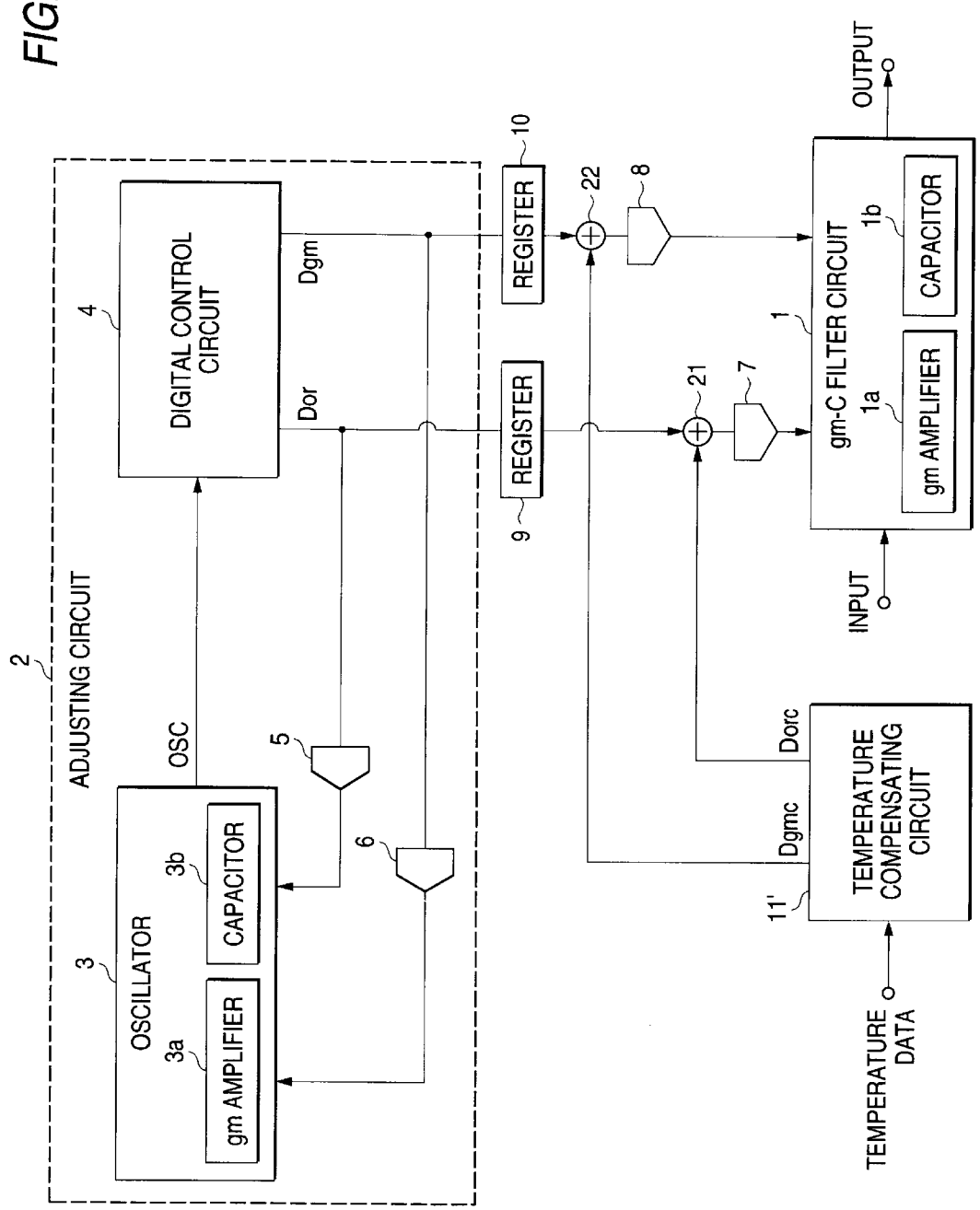
FIG. 6 is a block diagram for indicating an arrangement of a gm-C filter system according to a third embodiment mode of the present invention.
Figure 7:
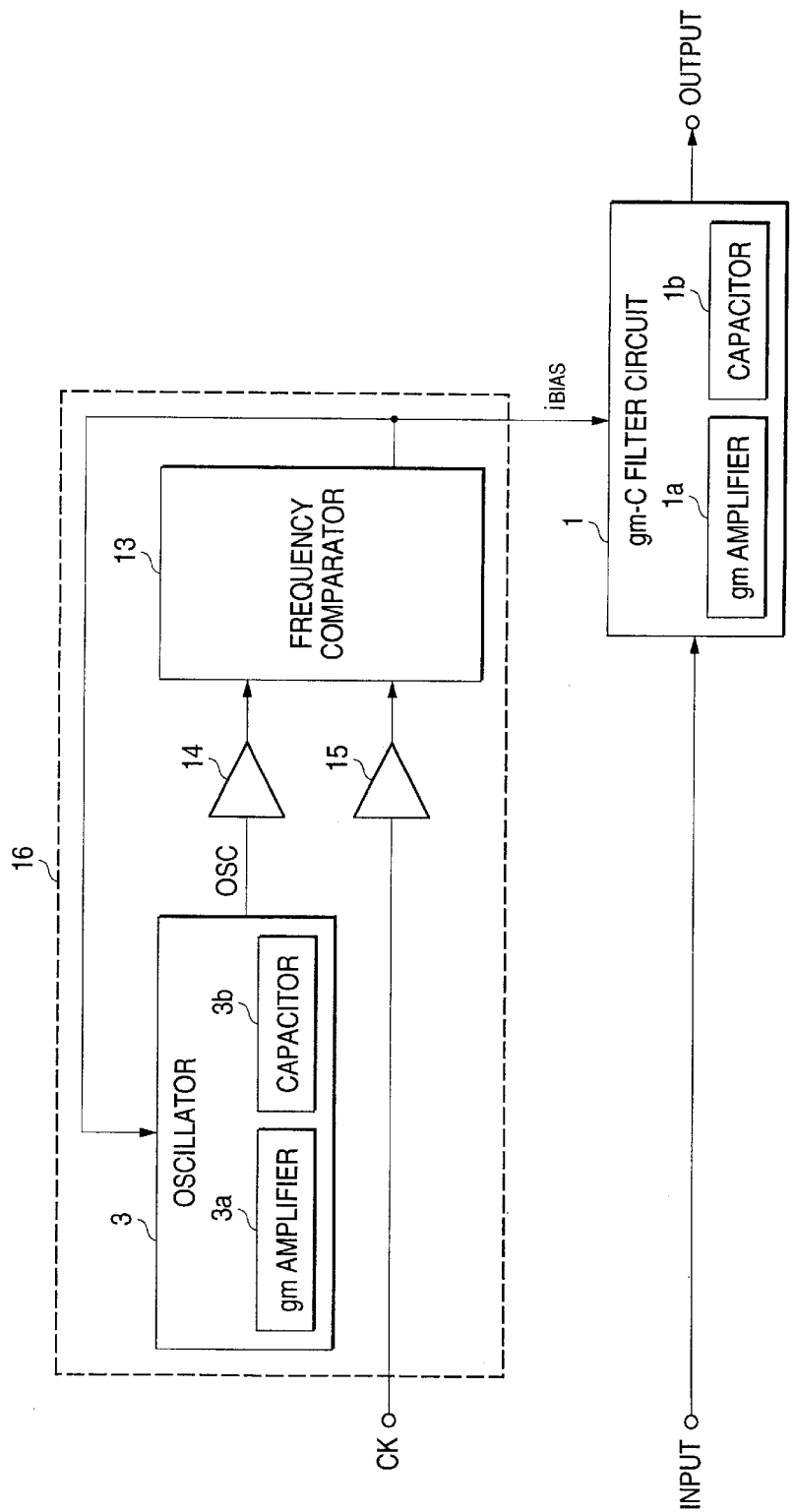
FIG. 7 is a block diagram for indicating an example of the conventional gm-C filter system.

FIG. 6 is a block diagram for representing an arrangement of a gm-C filter system according to a third embodiment mode of the present invention. It should be noted that the same reference numeral used in the first embodiment mode shown in FIG. 1 will be employed as those for denoting the same, or similar constructions of this third embodiment mode, and therefore, descriptions thereof are omitted. In FIG. 6, a temperature compensating circuit 11' produces such a compensating digital adjusting value "$D_{orc}$" capable of compensating for a variation component of output resistance values of the gm amplifier 1a with respect to a change contained in ambient temperatures based upon externally supplied temperature data, and also produces another compensating digital adjusting value "$D_{gmc}$" capable of compensating a variation component of gm values of the gm amplifier 1a with respect to a change contained in ambient temperatures. An adder 21 executes a digital calculation with respect to both the compensating digital adjusting value "$D_{orc}$" supplied from the temperature compensating circuit 11', and also a digital adjusting value "$D_{or}$" held in the register 9. Then, this adder 21 supplies the digitally calculated result to the D/A converter 7. Also, the adder 22 performs a digital calculation with respect to both the compensating digital adjusting value "$D_{gmc}$" supplied from the temperature compensating circuit 11' and also a digital adjustment value "$D_{gm}$" held in the register 10. Then, this adder 21 supplies the digitally calculated result to the D/A converter 8.

Next, a description will now be made of operations of the gm-C filter system according to this embodiment mode. First, the adjusting circuit 2 commences the adjusting operation of the filter characteristic when the gm-C filter system is initiated. After the adjusting operation has bee ended, both the digital adjusting values "$D_{or}$" and "$D_{gm}$" supplied from the adjusting circuit 2 are held in the registers 9 and 10, respectively, and the operation of the adjusting circuit 20 is stopped (power off state). While the operation of the adjusting circuit 2 is stopped (power off), both the digital adjusting values $D_{or}$ and $D_{gm}$ saved in the registers 9 and 10 are supplied via the D/A converters 7 and 8 as analog adjusting values (bias currents) to the gm amplifier 1a of the gm-C filter circuit 1. Thereafter, once the operation of the adjusting circuit 2 is stopped (power off state), even when the ambient temperature is changed, the adjusting circuit 2 is not operated, which is different from the above-explained operation of the first embodiment mode. Instead, both the compensating digital adjusting values "$D_{orc}$" and "$D_{gmc}$" are supplied from the temperature compensating circuit 11' to the adders 21 and 22, respectively, so that the filter characteristic is adjusted.

As previously explained, in accordance with the gm-C filter system of this embodiment mode, the adjusting circuit 2 is operated only when the gm-C filter system is initiated in order to adjust the filter characteristic, so that the power consumption can be reduced, as compared with that of the conventional filter system.

As apparent from the above-explained description, in accordance with the present invention, since the adjusting circuit for adjusting the filter characteristic is operated in the intermittent manner (otherwise, only when filter system is initiated), the gm-C filter system whose power consumption is low can be provided. The gm-C filter system of the present invention may be effectively used when, for instance, this gm-C filter system is used as such a filter system mounted on an LSI designed for a portable electronic appliance such as a portable telephone set.

What is claimed is:

1. A transconductance-capacitance filter system comprising:
   a transconductance-capacitance filter circuit including a transconductance amplifier and a capacitor;
   an adjusting circuit including an oscillator containing a transconductance amplifier having the same structure as that of the transconductance amplifier of said transconductance-capacitance filter circuit, said adjusting circuit producing a digital adjusting value used to adjust the transconductance of the transconductance amplifier of said oscillator based upon an oscillation signal outputted from said oscillator;
   a register for holding said digital adjusting value supplied from said adjusting circuit; and
   a D/A converter for converting said digital adjusting value held in said register into an analog adjusting value which is used to adjust the transconductance of the transconductance amplifier of said transconductance-capacitance filter circuit,
   wherein said adjusting circuit is operated in an intermittent manner.

2. A transconductance-capacitance filter system as claimed in claim 1, further comprising a temperature sensing circuit for sensing an ambient temperature of said transconductance-capacitance filter system,
   wherein said adjusting circuit is operated in the intermittent manner based upon a change contained in said ambient temperatures.

3. A transconductance-capacitance filter system as claimed in claim 1 further comprising a power supply voltage sensing circuit for sensing a power supply voltage of said transconductance-capacitance filter system,
   wherein said adjusting circuit is operated in the intermittent manner based upon a change contained in said power supply voltages.

4. A transconductance-capacitance filter system as claimed in claim 1 further comprising a temperature sensing circuit for sensing an ambient temperature of said transconductance-capacitance filter system, and a power supply voltage sensing circuit for sensing a power supply voltage of said transconductance-capacitance filter system,
   wherein said adjusting circuit is operated in the intermittent manner based upon either a change contained in the ambient temperatures or a variation of said power supply voltages.

5. A transconductance-capacitance filter system comprising:
   a transconductance-capacitance filter circuit including a transconductance amplifier and a capacitor;
   an adjusting circuit including an oscillator containing a transconductance amplifier having the same structure as that of the transconductance amplifier of said transconductance-capacitance filter circuit, said adjusting circuit producing a digital adjusting the transconductance of the transconductance amplifier of said oscillator based upon an oscillation signal outputted from said oscillator;
   a register for holding said digital adjusting value supplied from said adjusting circuit;
   a D/A converter for converting said digital adjusting value held in said register into an analog adjusting value which is used to adjust the transconductance of the transconductance amplifier of said transconductance-capacitance filter circuit; and
   a temperature compensating circuit for producing such a drive bias current capable of compensating for a variation component of the transconductance values of the transconductance amplifier of said transconductance-capacitance filter circuit with respect to a change contained in ambient temperatures of said transconductance-capacitance filter system based upon externally-supplied temperature data, and capable of driving said D/A converter by said drive bias current,
   wherein said adjusting circuit is operated only when said transconductance-capacitance filter system is initiated.

6. A transconductance-capacitance filter system comprising:
   a transconductance-capacitance filter circuit including a transconductance amplifier and a capacitor;
   an adjusting circuit including an oscillator containing a transconductance amplifier having the same structure as that of the transconductance amplifier of said transconductance-capacitance filter circuit, said adjusting circuit producing a digital adjusting the transconductance of the transconductance amplifier of said oscillator based upon an oscillation signal outputted from said oscillator;
   a register for holding said digital adjusting value supplied from said adjusting circuit;
   a temperature compensating circuit for producing such a drive bias current capable of compensating for a variation component of the transconductance values of the transconductance amplifier of said transconductance-capacitance filter circuit with respect to a change contained in ambient temperatures of said transconductance-capacitance filter system based upon externally-supplied temperature data, and capable of driving said D/A converter by said drive bias current;
   an adder for executing a digital calculation with respect to said compensating digital adjusting value supplied from said temperature compensating circuit and the digital adjusting value held in said register; and
   a D/A converter for converting a digital calculation result supplied form said adder into an analog adjusting value which is used to adjust the transconductance of the transconductance amplifier of said transconductance-capacitance filter circuit,
   wherein said adjusting circuit is operated only when said transconductance-capacitance filter system is initiated.

* * * * *

UNITED STATES PATENT AND TRADEMARK OFFICE
CERTIFICATE OF CORRECTION

PATENT NO. : 6,388,510 B2
DATED : May 14, 2002
INVENTOR(S) : Hiroki Hayashi et al.

It is certified that error appears in the above-identified patent and that said Letters Patent is hereby corrected as shown below:

<u>Title page,</u>
Item [75], please delete "Hiroki Hayashi, Kawasaki; Shiro Doushoh, Ikeda, Takashi Morie, Ibaraki; Kunihiro Fujiyama, Takatsuki; Tomoyuki Katada, Kawasaki, all of (JP)",
and insert therefor -- Hiroki Hayashi, Kawasaki-shi; Shiro Dosho, Osaka; Takashi Morie, Osaka; Hirokuni Fujiyama, Osaka; Tomoyuki Katada, Kawasaki-shi, all of (JP) --.

Signed and Sealed this

Eighth Day of October, 2002

*Attest:*

*Attesting Officer*

JAMES E. ROGAN
*Director of the United States Patent and Trademark Office*